US011085111B2

(12) United States Patent
Nordman et al.

(10) Patent No.: US 11,085,111 B2
(45) Date of Patent: Aug. 10, 2021

(54) LAMINATE COMPOSITE STRUCTURAL COMPONENTS AND METHODS FOR THE SAME

(71) Applicant: The Boeing Company, Chicago, IL (US)

(72) Inventors: Paul S. Nordman, Everett, WA (US); Jiangtian Cheng, Mukilteo, WA (US)

(73) Assignee: THE BOEING COMPANY, Chicago, IL (US)

( * ) Notice: Subject to any disclaimer, the term of this patent is extended or adjusted under 35 U.S.C. 154(b) by 182 days.

(21) Appl. No.: 16/157,886

(22) Filed: Oct. 11, 2018

(65) Prior Publication Data
US 2020/0115793 A1 Apr. 16, 2020

(51) Int. Cl.
| | | |
|---|---|---|
| B32B 33/00 | (2006.01) | |
| B05D 1/00 | (2006.01) | |
| B32B 37/00 | (2006.01) | |
| C23C 16/01 | (2006.01) | |
| B32B 15/04 | (2006.01) | |
| C23C 16/06 | (2006.01) | |
| C23C 16/40 | (2006.01) | |

(52) U.S. Cl.
CPC .......... *C23C 16/01* (2013.01); *B05D 1/60* (2013.01); *B32B 15/04* (2013.01); *B32B 2250/05* (2013.01); *B32B 2605/18* (2013.01); *C23C 16/06* (2013.01); *C23C 16/40* (2013.01)

(58) Field of Classification Search
None
See application file for complete search history.

(56) References Cited

U.S. PATENT DOCUMENTS

| | | | |
|---|---|---|---|
| 5,855,828 A | 1/1999 | Tuffias et al. | |
| 5,885,368 A * | 3/1999 | Lupo | C07C 17/12 136/255 |
| 6,458,309 B1 * | 10/2002 | Allen | B29C 70/446 264/319 |
| 6,613,393 B1 | 9/2003 | Rauschnabel et al. | |
| 6,866,901 B2 | 3/2005 | Burrows et al. | |
| 7,198,832 B2 | 4/2007 | Burrows et al. | |
| 7,510,913 B2 | 3/2009 | Moro et al. | |
| 7,625,618 B1 * | 12/2009 | Allen | B29C 70/44 428/36.91 |

(Continued)

OTHER PUBLICATIONS

Extended European Search Report dated Mar. 19, 2020 in corresponding European Application 19202363.8, 7 pages.

(Continued)

*Primary Examiner* — Jacob T Minskey
*Assistant Examiner* — Baileigh Kate Darnell
(74) *Attorney, Agent, or Firm* — MH2 Technology Law Group LLP

(57) ABSTRACT

A method for fabricating a structural part is disclosed. The method can include forming a plurality of layers on a base of a system having one or more application heads. Forming the plurality of layers can include forming alternating layers of a first material and a second material. Forming the alternating layers can include forming a first layer from the first material, and forming a second layer adjacent the first layer from the second material. The plurality of layers can form the structural part, and one or more dimensions of the structural part can be greater than or equal to about 0.05 cm.

20 Claims, 3 Drawing Sheets

(56) References Cited

U.S. PATENT DOCUMENTS

| | | | |
|---|---|---|---|
| 7,648,925 B2 | 1/2010 | Moro et al. | |
| 7,727,601 B2 | 6/2010 | Burrows et al. | |
| 7,767,498 B2 | 8/2010 | Moro et al. | |
| 8,585,856 B1 * | 11/2013 | Boone | B29D 99/0014 |
| | | | 156/285 |
| 2003/0219605 A1 | 11/2003 | Molian et al. | |
| 2005/0045105 A1 | 3/2005 | Choi et al. | |
| 2005/0181203 A1 * | 8/2005 | Rawlings | B32B 15/085 |
| | | | 428/337 |
| 2010/0038030 A1 * | 2/2010 | Allen | B29D 22/00 |
| | | | 156/307.1 |
| 2010/0310786 A1 * | 12/2010 | Dunne | B29C 64/188 |
| | | | 427/487 |
| 2012/0165969 A1 * | 6/2012 | Elsey | B29C 64/188 |
| | | | 700/120 |
| 2014/0272597 A1 * | 9/2014 | Mikhaylik | H01M 10/0565 |
| | | | 429/233 |
| 2017/0057167 A1 * | 3/2017 | van Tooren | B33Y 50/02 |
| 2017/0174312 A1 * | 6/2017 | Cross | B29C 70/885 |
| 2019/0232550 A1 * | 8/2019 | Mark | B33Y 40/00 |

OTHER PUBLICATIONS

Wang et al., "Strength and Plasticity of Nanolaminated Materials," Materials Research Letters, Sep. 1, 2016, pp. 1-19.

* cited by examiner

LAMINATE COMPOSITE STRUCTURAL COMPONENTS AND METHODS FOR THE SAME

TECHNICAL FIELD

The present teachings relate to the field of structural fabrication, and more particularly, to systems and methods for fabricating structural, load-bearing components or parts.

BACKGROUND

Conventional structural, load-bearing components and parts are utilized in a myriad of applications and industrial processes that expose the structural parts to extreme conditions (e.g., mechanical stress, high temperatures, etc.). Accordingly, these structural parts are often fabricated from materials, such as metals and alloys, which provide the required strength and stiffness to endure these extreme conditions. For example, conventional blades and wings of an airplane are often fabricated from materials that provide the strength, ductility, and stiffness necessary to withstand the conditions to sustain flight.

As advancements are made, however, requirements for these structural parts are heightened. In many cases, to meet the heightened production requirements, the size or dimensions and/or the general strength of the structural parts are often increased. Increasing the size of the structural parts and/or increasing the general strength, however, often results in a corresponding increase in mass due to the high density of the materials utilized, which can be detrimental to efficient operation and production of the structural parts. In view of the foregoing, attempts have been made to discover or create new materials having improved properties (e.g., size, strength, and/or stiffness) that meet or exceed those of conventional metals and alloys. These attempts have resulted in the development of structural parts formed from composite materials. While these composite materials exhibit improved mechanical properties, further improvements in the mechanical properties and methods for fabricating the composite structural parts are necessary to make further advances in technology.

What is needed, then, are improved structural parts and methods for fabricating the structural parts.

SUMMARY

The following presents a simplified summary in order to provide a basic understanding of some aspects of the present teachings. This summary is not an extensive overview, nor is it intended to identify key or critical elements of the present teachings, nor to delineate the scope of the disclosure. Rather, its primary purpose is merely to present one or more concepts in simplified form as a prelude to the detailed description presented later.

Examples of the disclosure provide a method for fabricating a structural part. The method includes forming a plurality of layers, wherein forming the plurality of layers includes forming alternating layers of a first material and a second material. Forming the alternating layers can include forming a first layer from the first material, and forming a second layer adjacent the first layer from the second material. The plurality of layers can form the structural part, and one or more dimensions of the structural part is greater than or equal to about 0.05 cm. The plurality of layers can be formed from a vacuum deposition process. The first material can include an organic material. The organic material can include one or more polymers. The second material can include an inorganic material. The inorganic material can include one or more silicates. The first material or the second material can include one or more ceramics. Forming the plurality of layers can include forming the first layer on a mandrel. The method can include removing the mandrel from the plurality of layers. In one example, the mandrel can form at least a portion of the structural part. In one example, forming the plurality of layers can include forming a third layer adjacent the second layer from a third material, and forming a fourth layer adjacent the third layer from the third material. The third material can include or be a metal. In at least one example, forming the plurality of layers can include forming a third layer from a third material, forming a fourth layer adjacent the third layer from the third material, and forming the first layer adjacent the third layer from the first material. In at least one example, the structural part can be a structural part of a transportation vehicle or vessel.

Examples of the disclosure can further provide a system for fabricating a structural part. The system can include a base configured to support the structural part, and a plurality of application heads disposed proximal the base and configured to deposit a plurality of layers of one or more materials to form the structural part. The base and at least one of the plurality of application heads can be configured to move relative to one another during deposition of the plurality of layers.

Examples of the disclosure can further provide a method for fabricating a structural part. The method can include forming a plurality of layers on a base of a system with one or more application heads. Forming the plurality of layers can include forming alternating layers of a first material and a second material. Forming the alternating layers can include forming a first layer from the first material, and forming a second layer adjacent the first layer from the second material. The plurality of layers form the structural part, and one or more dimensions of the structural part can be greater than or equal to 0.05 cm. The method can include moving the base relative to the one or more application heads. The method can also include disposing a mandrel adjacent the base, and forming the plurality of layers on the mandrel with the one or more application heads.

The features, functions, and advantages that have been discussed can be achieved independently in various implementations or can be combined in yet other implementations further details of which can be seen with reference to the following description and drawings.

BRIEF DESCRIPTION OF THE DRAWINGS

The accompanying drawings, which are incorporated in and constitute a part of this specification, illustrate the present teachings and together with the description, serve to explain the principles of the disclosure. In the figures.

Figure 1:
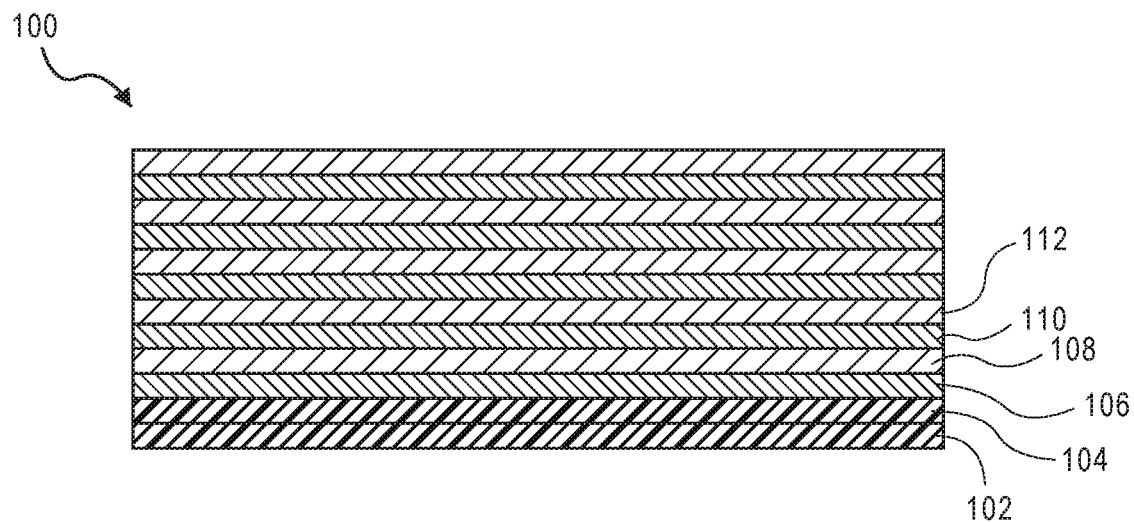
FIG. 1 illustrates a side, cross-sectional view of an exemplary structural part, according to one or more implementations disclosed.

It should be noted that some details of the Figures have been simplified and are drawn to facilitate understanding of the present teachings rather than to maintain strict structural accuracy, detail, and scale.

DETAILED DESCRIPTION

The following description of various typical aspect(s) is merely exemplary in nature and is in no way intended to limit the disclosure, its application, or uses.

As used throughout this disclosure, ranges are used as shorthand for describing each and every value that is within the range. It should be appreciated and understood that the description in a range format is merely for convenience and brevity, and should not be construed as an inflexible limitation on the scope of any examples or implementations disclosed herein. Accordingly, the disclosed range should be construed to have specifically disclosed all the possible subranges as well as individual numerical values within that range. As such, any value within the range can be selected as the terminus of the range. For example, description of a range such as from 1 to 5 should be considered to have specifically disclosed subranges such as from 1.5 to 3, from 1 to 4.5, from 2 to 5, from 3.1 to 5, etc., as well as individual numbers within that range, for example, 1, 2, 3, 3.2, 4, 5, etc. This applies regardless of the breadth of the range.

Unless otherwise specified, all percentages and amounts expressed herein and elsewhere in the specification should be understood to refer to percentages by weight. The amounts given are based on the active weight of the material.

Additionally, all numerical values are "about" or "approximately" the indicated value, and take into account experimental error and variations that would be expected by a person having ordinary skill in the art. It should be appreciated that all numerical values and ranges disclosed herein are approximate values and ranges, whether "about" is used in conjunction therewith. It should also be appreciated that the term "about," as used herein, in conjunction with a numeral refers to a value that can be ±0.01% (inclusive), ±0.1% (inclusive), ±0.5% (inclusive), ±1% (inclusive) of that numeral, ±2% (inclusive) of that numeral, ±3% (inclusive) of that numeral, ±5% (inclusive) of that numeral, ±10% (inclusive) of that numeral, or ±15% (inclusive) of that numeral. It should further be appreciated that when a numerical range is disclosed herein, any numerical value falling within the range is also specifically disclosed.

As used herein, "free" or "substantially free" of a material can refer to a composition, component, or phase where the material is present in an amount of less than 10.0 weight %, less than 5.0 weight %, less than 3.0 weight %, less than 1.0 weight %, less than 0.1 weight %, less than 0.05 weight %, less than 0.01 weight %, less than 0.005 weight %, or less than 0.0001 weight % based on a total weight of the composition, component, or phase.

All references cited herein are hereby incorporated by reference in their entireties. In the event of a conflict in a definition in the present disclosure and that of a cited reference, the present disclosure controls.

Reference will now be made in detail to examples of the present teachings, which are illustrated, in the accompanying drawings. Wherever possible, the same reference numbers will be used throughout the drawings to refer to the same or like parts.

Exemplary structural components or parts and methods for the same are disclosed herein. The structural parts disclosed herein can have improved isotropic stiffness and strength, improved strength and stiffness under tension and/or compression in all directions, reduced delamination, reduced inconsistencies, and/or improved interface bonding, as compared to conventional structural parts. The improved isotropic stiffness and strength can be provided by the strength of inorganic materials utilized to form the structural parts. For example, the improved isotropic stiffness and strength can be provided by the strength of the silicates utilized to form the structural parts. The improved isotropic strength and stiffness can also be provided by the absence or substantial absence of water in the inorganic materials (e.g., silicates), which can contaminate and reduce the strength of the inorganic materials. The ability to exclude water in the inorganic materials can be provided by the methods disclosed herein. The methods disclosed herein to fabricate the structural parts can produce structural parts having improved isotropic stiffness and strength, improved strength and stiffness under tension and/or compression in all directions, reduced delamination, reduced inconsistencies, and/or improved interface bonding, as compared to conventional structural parts and conventional methods for fabricating the structural parts. For example, the methods for fabricating the structural part can include fabricating the structural part in a vacuum to thereby reduce or eliminate processing inconsistencies and/or exclude contaminants, such as water, which can contaminate and reduce the strength of the materials used to fabricate the structural part. The methods disclosed herein can also eliminate larger micron-sized inconsistencies and provide stronger bonding interfaces between layers of the structural parts through layer by layer deposition and/or through vacuum deposition, which can eliminate contaminants from the deposition process. The methods disclosed herein allow the shape and/or contour of a structural part to be fabricated to be ignored, and frees the design and manufacturing processes from limitations imparted by the shape and/or contour of the structural part. The methods disclosed herein also allow for relatively shorter manufacturing times.

FIG. 1 illustrates a side, cross-sectional view of an exemplary structural component or part 100, according to one or more implementations disclosed. As illustrated in FIG. 1, the structural part 100 can include a plurality of layers (six layers are indicated 102, 104, 106, 108, 110, 112). It should be appreciated that the number of layers illustrated is only exemplary and the number of distinct layers can be from about 2 to about 75,000 layers or more. For example, the number of layers 102, 104, 106, 108, 110, 112 utilized to form the structural part 100 can be from about 2, about 100, about 1,000, about 10,000, about 20,000, or about 30,000 to about to about 40,000, about 50,000, about 60,000, about 75,000, or more.

In at least one implementation, as further described herein, the structural part 100 can be fabricated as a single or monolithic piece including the plurality of layers 102, 104, 106, 108, 110, 112, where one or more of the layers 102, 104, 106, 108, 110, 112 can be or form at least a portion of a substrate. Fabricating the structural part 100 as a monolithic piece can provide improved isotropic strength and stiffness. In another implementation, as discussed below, the structural part 100 can be fabricated on a mandrel, thereby forming the structural part 100 including the mandrel and the plurality of layers 102, 104, 106, 108, 110, 112. It should be appreciated that the mandrel can be integral to the structural part 100 or removable from the structural part 100.

The structural part 100 may not be or form a portion of a coating or an encapsulation. For example, typical or conventional coatings and encapsulations are generally composed of laminate structures, components, or composites having a thickness less than or equal to about 0.03 cm, less than or equal to about 0.025 cm, less than or equal to about 0.020 cm, or less than or equal to about 0.010 cm. As such, one or more dimensions (i.e., height, width, depth, thickness, etc.) of the structural part 100 can be greater than or equal to about 0.010 cm, greater than or equal to about 0.020 cm, greater than or equal to about 0.025 cm, greater than or equal to about 0.03 cm, greater than or equal to about 0.035 cm, greater than or equal to about 0.04 cm, greater than or equal to about 0.045 cm, greater than or equal to about 0.05 cm, greater than or equal to about 0.055 cm, greater than or equal to about 0.1 cm, greater than or equal to about 0.2 cm, greater than or equal to about 0.5 cm, greater than or equal to about 1 cm, or more.

The thickness of each of the layers 102, 104, 106, 108, 110, 112 of the structural part 100 is not particularly limited, but can be at least partially determined by one or more desired properties of the structural part 100 and/or the layers 102, 104, 106, 108, 110, 112 thereof. It should be appreciated that each of the layers 102, 104, 106, 108, 110, 112 can have a thickness that varies widely. In at least one implementation, each of the layers 102, 104, 106, 108, 110, 112, separately and independently, can have a thickness of from about 1 nm (0.001 µm) to about 20 µm. For example, each one of the layers 102, 104, 106, 108, 110, 112, separately and independently, can have a thickness of from about 0.001 µm, about 0.01 µm, about 0.05 µm, about 0.1 µm, about 0.5 µm, about 1 µm, about 2 µm, or about 4 µm to about 6 µm, about 8 µm, about 10 µm, about 12 µm, about 14 µm, about 16 µm, about 18 µm, or about 20 µm.

Each of the one or more layers 102, 104, 106, 108, 110, 112 of the structural part 100 can be fabricated from one or more materials. For example, each of layers 102, 104, 106, 108, 110, 112 of the structural part 100 can be fabricated from a single material or a plurality of materials. For example, at least one layer of the plurality of layers 102, 104, 106, 108, 110, 112 can be fabricated from a single material. In another example, at least a portion of one layer of the plurality of layers 102, 104, 106, 108, 110, 112 can be fabricated from a first material and another portion of the one layer can be fabricated from a second material. In at least one implementation, adjacent layers of the one or more 102, 104, 106, 108, 110, 112 can be fabricated from the same material. In another implementation, adjacent layers of the one or more layers 102, 104, 106, 108, 110, 112 can be fabricated from different materials. In an exemplary implementation, at least a portion of the structural part 100 includes alternating layers of at least two materials. For example, at least a portion of the structural part 100 can include a first layer fabricated from a first material, a second layer fabricated from a second material, a third layer fabricated from the first material, and a fourth layer fabricated from the second material.

The one or more materials utilized to form the one or more layers 102, 104, 106, 108, 110, 112 of the structural part 100 can vary widely. For example, each of the materials utilized to form the one or more layers 102, 104, 106, 108, 110, 112 can be or include one or more inorganic materials, one or more organic materials, one or more ceramics, one or more alloys, one or more metals, one or more superalloys, one or more non-metals, one or more metalloids, one or more binders, one or more additives, or any combination, compounds, or composites thereof. Ceramics can provide high temperature strength and stiffness as well as a thermal barrier and burn through protection for the structural part 100.

In an exemplary implementation, at least a portion of the structural part 100 can be or include or be fabricated from alternating layers of inorganic materials and organic materials. The alternating layers of inorganic and organic materials can be transparent or substantially transparent. The structural part 100 can have an overall transparency, as measured by the transmissivity of light, of from about 30% to about 95% or greater. For example, the structural part 100 can have an overall transparency of from about 30%, about 40%, about 50%, about 60%, or about 70% to about 75%, about 80%, about 85%, about 90%, about 95%, or greater.

The inorganic materials can be or include, but are not limited to, one or more silicates (e.g., silicate glass), or other inorganic materials formed from suitable alkoxides, one or more oxides, such as aluminum oxide, silicon oxide, hafnium oxide, zirconium oxide, lanthanum oxide, tungsten oxide, or the like, or any composite, compound, or combination thereof. Utilizing silicates can reduce costs.

The organic materials can be or include, but are not limited to, one or more polymers. Utilizing the organic materials can provide bonding strength between adjacent layers and/or at least partially reduce brittleness of the structural part 100. Additionally, utilizing the organic materials can provide moisture and/or impact protection to the structural part 100. Utilizing polymers as the organic material can reduce cost, facilitate processing, and/or maintain weight efficiency. Illustrative polymers can be or include, but are not limited to, thermoplastics, polyolefin-based polymers, acryl-based polymers, polyurethane-based polymers, ether-based polymers, polyester-based polymers, polyamide-based polymers, formaldehyde-based polymers, silicon-based polymers, or any combination thereof. For example, the polymers can include, but are not limited to, poly(ether ether ketone) (PEEK), TORLON®, polyamide-imides, polyethylene (PE), polyvinyl fluoride (PVF), polyvinyl chloride (PVC), polyvinylidene fluoride (PVDF), polyvinylidene chloride (PVDC), polychlorotrifluoroethylene (PCTFE), polytetrafluoroethylene (PTFE), polyether sulfone (PES), polyethylene naphthalate (PEN), polypropylene (PP), poly(1-butene), poly(4-methylpentene), polystyrene, polyvinyl pyridine, polybutadiene, polyisoprene, polychloroprene, styrene-acrylonitrile copolymer, acrylonitrile-butadiene-styrene terpolymer, ethylene-methacrylic acid copolymer, styrene-butadiene rubber, tetrafluoroethylene copolymer, polyacrylate, poly(methylmethacrylate) (PMMA), polylactic acid, nylon, acrylonitrile butadiene styrene, polybenzimidazole, polycarbonate, polyoxymethylene, polyetherimide, polyphenyl oxide (PPO), polymethacrylate, polyacrylamide, polyvinyl acetate, polyvinyl alcohol, polyvinyl butyral, polyvinyl ether, polyvinylpyrrolidone, polyvinylcarbazole, polyurethane, polyacetal, polyethylene glycol, polypropylene glycol, epoxy resins, polyphenylene oxide, polyethylene terephthalate, polybutylene terephthalate, polydihydroxymethylcyclohexyl terephthalate, cellulose esters, polycarbonate, polyamide, polyimide, any copolymers thereof, or any combination thereof. Additionally illustrative polymers can also include, but are not limited to, polymers created from styrene polymer precursors, methyl styrene polymer precursors, (meth)acrylate polymer precursors, both fluorinated and non-fluorinated forms of these precursors, and combinations of two or more of these precursors. It can be appreciated that the polymers can include any combination of at least two or more of the foregoing.

In at least one implementation, the one or more polymers can be or include an elastomer, synthetic rubber, or any combination thereof. Illustrative elastomeric materials and synthetic rubbers can include, but are not limited to, VITON®, nitrile, polybutadiene, acrylonitrile, polyisoprene, neoprene, butyl rubber, chloroprene, polysiloxane, styrene-butadiene rubber, hydrin rubber, silicone rubber, ethylene-propylene-diene terpolymers, any copolymers thereof, or any combination thereof.

The metals of the one or more layers 102, 104, 106, 108, 110, 112 of the structural part 100 can be or include, but are not limited to, one or more alkali metals, one or more alkaline earth metals, one or more transition metals, one or more post-transition metals, or any mixtures, alloys, or compounds thereof. Illustrative transition metals can include, but are not limited to, chromium, iron, cobalt, molybdenum, tungsten, tantalum, titanium, zirconium, niobium, rhenium, yttrium, vanadium, hafnium, or any mixtures, alloys, or compounds thereof. Illustrative metals can also be or include, but are not limited to, aluminum, iron, titanium, or the like, or any combination thereof. The metals can also be or include metal alloys and superalloys, such as stainless steel, carbon steel, a nickel-based superalloy, a cobalt-based superalloy, or the like, or any combination thereof. The one or more metalloids can be or include, but are not limited to, boron, silicon, antimony, or any mixtures or compounds thereof. Utilizing the metals for the one or more layers 102, 104, 106, 108, 110, 112 of the structural part 100 can provide electromagnetic energy (EME) protection and/or structural stiffness and/or strength.

In an exemplary implementation, no binders are disposed between adjacent layers 102, 104, 106, 108, 110, 112 of the structural part 100. For example, the adhesion or binding of the adjacent layers 102, 104, 106, 108, 110, 112 of the structural part 100 can be provided by the layers of materials themselves at the interface thereof. It should be appreciated that omitting binders can simplify the fabrication and/or reduce cost of fabricating the structural part 100. In another implementation, one or more binders can be interposed between adjacent layers 102, 104, 106, 108, 110, 112 of the structural part 100, and configured to combine, couple, and/or agglomerate each of the layers 102, 104, 106, 108, 110, 112 of the structural part 100 with one another to thereby reduce delamination. Illustrative binders can be or include, but are not limited to, one or more metallic binders, inorganic binders, organic binders, or any combination thereof. Illustrative metallic binders can include, but are not limited to, any one or more transition metals including, but not limited to, magnesium, ruthenium, osmium, iron, cobalt, nickel, copper, molybdenum, tantalum, tungsten, rhenium, or any mixtures, compounds, or alloys thereof. The metallic binders can also include, but are not limited to, any alkali metals including, but not limited to, lithium, sodium, potassium, rubidium, cesium, or any mixtures, compounds, or alloys thereof. Illustrative organic binders can be or include, but are not limited to, one or more waxes or resins that are insoluble, or at least substantially insoluble, in water. Waxes can include, for example, animal waxes, vegetable waxes, mineral waxes, synthetic waxes, or any combination thereof.

In an exemplary operation, with continued reference to FIG. 1, a method of fabricating or forming the structural part 100 can include depositing or forming a first layer or substrate 102. The method can also include depositing or forming a second layer 104 adjacent the first layer 102, and binding the first layer 102 and the second layer 104 with one another. In one example, the binding of the first layer 102 and the second layer 104 with one another can be performed concurrently with the deposition of the second layer 104. In another example, the binding of the first layer 102 and the second layer 104 with one another can be performed after deposition of the second layer 104. For example, the binding of the first layer 102 and the second layer 104 can be facilitated by one or more processes, such as heating, curing, or the like. In at least one example, illustrated in FIG. 1, the first and second layers 102, 104 can be formed from metallic materials, such as aluminum.

The method of fabricating the structural part 100 can also include depositing alternating organic and inorganic layers adjacent the metallic first and second layers 102, 104. For example, the method can include depositing a third layer 106 of an inorganic material, such as a silicate, adjacent the second layer 104, and depositing a fourth layer 108 of an organic material, such as a polymer (e.g., thermoplastic) adjacent the third layer 106. Depositing alternating organic and inorganic layers can allow the fabrication of the structural part 100 with a plurality of nano or micron sized layers. The method can further include a depositing a fifth layer 110 of an inorganic material adjacent the fourth layer 108, and depositing a sixth layer 112 of an organic material adjacent the fifth layer 110. It should be appreciated that the inorganic material utilized to form the third layer 106 and the fifth layer 110 can be the same or different. Similarly, the organic material utilized to form the fourth layer 108 and the sixth layer 112 can be the same or different. While FIG. 1 illustrates the third layer 106 being fabricated with an inorganic material, it should be appreciated that the third layer 106 deposited adjacent the metallic second layer 104 can alternatively be fabricated from an organic material, such as a thermoplastic.

While the structural part 100 illustrated in FIG. 1 is described as being fabricated by first forming the first and second metallic layers 102, 104, it should be appreciated that the structural part 100 can similarly be fabricated in the opposite direction, where the alternating organic and inorganic layers 106, 108, 110, 112 are formed, and the metallic layers 102, 104 are subsequently formed adjacent the alternating organic and inorganic layers 106, 108, 110, 112.

The structural part 100 can be fabricated via any suitable manufacturing processes or techniques. Illustrative processes can be or include, but are not limited to, vacuum deposition processes, such as sputtering, evaporation, sublimation, chemical vapor deposition (CVD), plasma enhanced chemical vapor deposition (PECVD), electron cyclotron resonance-plasma enhanced vapor deposition (ECR-PECVD), thermal spraying, sputtering, electron beam physical vapor deposition, pulsed laser deposition, or any combination thereof. Utilizing vacuum deposition processes can provide the structural part 100 with reduced inconsistencies, as vacuum deposition processes can allow contaminants (e.g., water), that can introduce inconsistencies and/or reduce strength of the materials, to be excluded from fabrication of the structural part 100.

Figure 2:
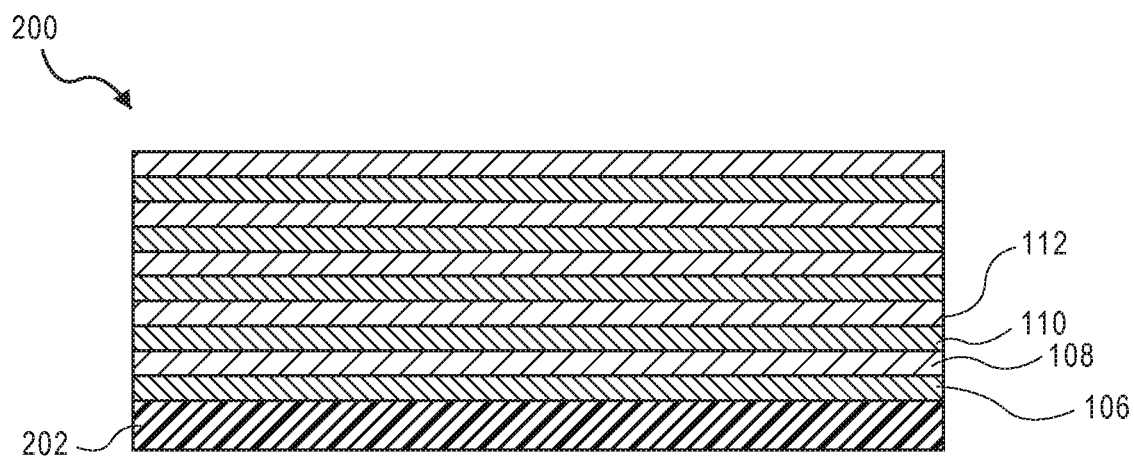
FIG. 2 illustrates a side, cross-sectional view of another exemplary structural part including a mandrel and a plurality of layers, according to one or more implementations disclosed.

FIG. 2 illustrates a side, cross-sectional view of another exemplary structural part 200 including a mandrel 202 and a plurality of layers 106, 108, 110, 112, according to one or more implementations disclosed. The structural part 200 illustrated in FIG. 2 can be similar in some respects to the structural part 100 described above and therefore can be best understood with reference to the description of FIG. 1, where like numerals designate like components and will not be described again in detail. As illustrated in FIG. 2, in at least one implementation, the metallic layers 102, 104 of FIG. 1 can be replaced by a mandrel 202, and the alternating layers 106, 108, 110, 112 of the inorganic and organic materials can be deposited on or adjacent the mandrel 202. For example, instead of forming the metallic layers 102, 104 of FIG. 1, the structural part 200 can utilize the mandrel 202 and deposit a plurality of layers 106, 108, 110, 112 on the mandrel 202 to fabricate the structural part 200, thereby simplifying the fabrication of the structural part 200. As discussed above, the mandrel 202 can be integral to or form a portion of the structural part 200. Utilizing the mandrel 202 as an integral part of the structural part 200 can provide additional structural strength and/or stiffness to the structural part 200. In another implementation, the mandrel 202 can be or form a portion of a substrate for the plurality of layers 106, 108, 110, 112, and the mandrel 202 can be separated or removed from the layers 106, 108, 110, 112 to form the structural part 200. As such, the structural part 200 can be fabricated to have any curve or contour of the mandrel 202.

In an exemplary operation, with continued reference to FIG. 2, a method of fabricating or forming the structural part 200 can include disposing or forming the a first layer 106 adjacent the mandrel 202, and forming a subsequent layer 108 adjacent the first layer 106. The method also include binding the layers 106, 108 with one another to reduce delamination. As discussed above, binding the layers 106, 108 with one another can be performed concurrently with the deposition of the second layer 108, or after deposition of the second layer 108. As illustrated in FIG. 2, the method of fabricating the structural part 200 can include depositing alternating layers 106, 108, 110, 112 of different materials. For example, the method can include depositing alternating layers 106, 108, 110, 112 of organic and inorganic materials, such as alternating layers of a silicate and a polymer.

Figure 3:
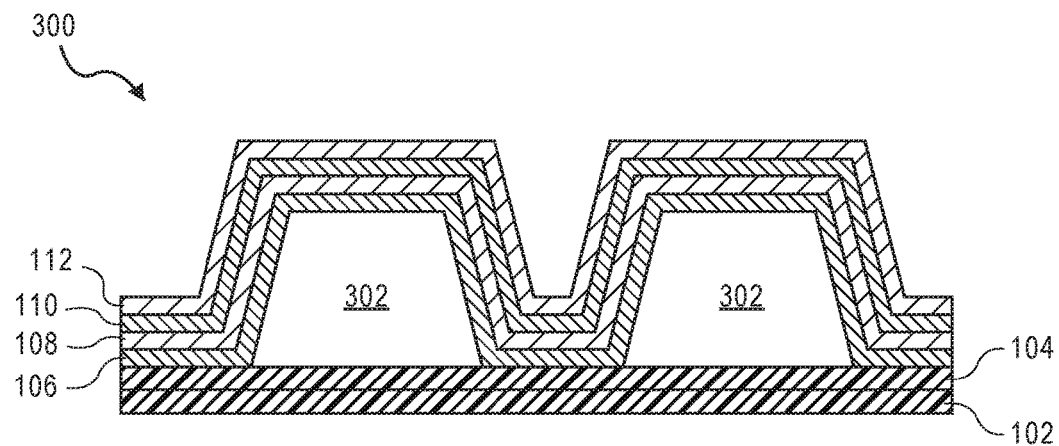
FIG. 3 illustrates a side, cross-sectional view of another exemplary structural part including a mandrel and a plurality of layers, according to one or more implementations disclosed.

FIG. 3 illustrates a side, cross-sectional view of another exemplary structural part 300 including a mandrel 302 and a plurality of layers 102, 104, 106, 108, 110, 112, according to one or more implementations disclosed. The structural part 300 illustrated in FIG. 3 can be similar in some respects to the structural part 100 described above and therefore can be best understood with reference to the description of FIG. 1, where like numerals designate like components and will not be described again in detail. As illustrated in FIG. 3, the structural part 300 can include a plurality of layers 102, 104, 106, 108, 110, 112, and one or more mandrels (two are shown 302) interposed between two or more of the plurality of layers 102, 104, 106, 108, 110, 112. The mandrels 302 can be integral to or form a portion of the structural part 300. In another implementation, the mandrels 302 can be separated or removed from the layers 102, 104, 106, 108, 110, 112 to form the structural part 300.

In an exemplary operation, with continued reference to FIG. 3, a method of fabricating or forming the structural part 300 can include depositing or forming the first and second layers 102, 104, as described above with respect to FIG. 1, to form a portion of the structural part 300. The method can also include disposing, positioning, binding, placing, or otherwise securing the one or more mandrels 302 adjacent the layers 102, 104 forming the portion of the structural part 300. The method can further include depositing subsequent layers 106, 108, 110, 112 adjacent the second layer 104 and the mandrels 302, as illustrated in FIG. 3, thereby forming the structural part 300 having the mandrels 302 interposed between at least two adjacent layers 104, 106. As illustrated in FIG. 3, the layers 106, 108, 110, 112 can be fabricated from alternating layers of different materials. In another example, the layers 106, 108, 110, 112 can be fabricated from the same material.

The mandrels 202, 302 disclosed herein can be fabricated from any one or more of the materials described above with respect to the one or more layers 102, 104, 106, 108, 110, 112. For example, the mandrels 202, 302 disclosed herein can be fabricated from one or more inorganic materials, one or more organic materials, one or more ceramics, one or more alloys, one or more metals, one or more superalloys, one or more non-metals, one or more metalloids, one or more binders, one or more additives, or any combination, compounds, or composites thereof.

Figures 4A, 4B:
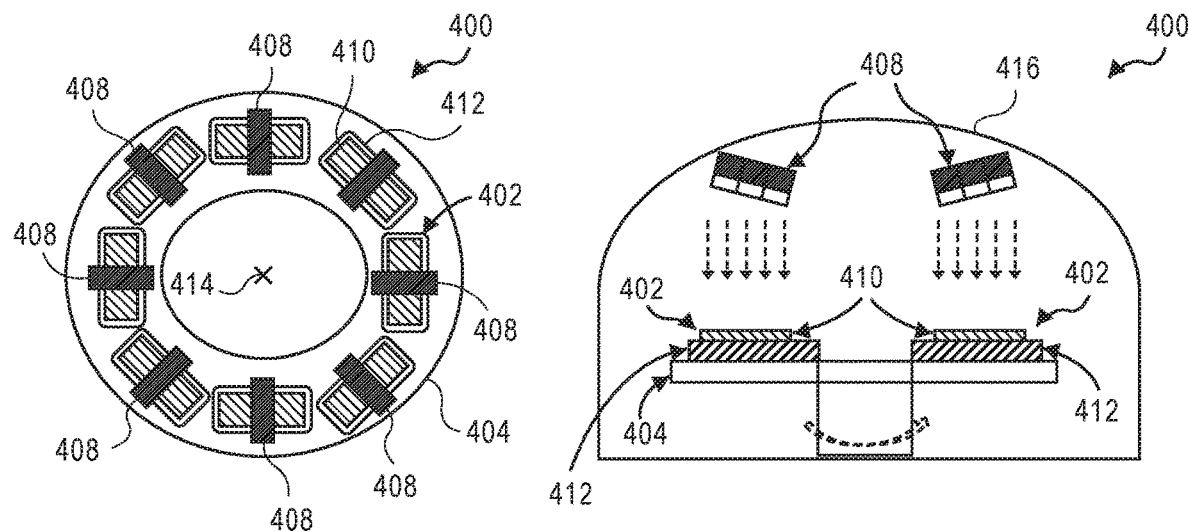
FIG. 4A illustrates a side cross-sectional view of a system for fabricating a structural part, according to one or more implementations disclosed.
FIG. 4B illustrates an overhead or plan view of the exemplary system of FIG. 4A, according to one or more implementations disclosed.

FIG. 4A illustrates a side cross-sectional view of a system 400 for fabricating a structural part 402, according to one or more implementations disclosed. FIG. 4B illustrates an overhead or plan view of the exemplary system 400 of FIG. 4A, according to one or more implementations disclosed. As illustrated in FIGS. 4A and 4B, the system 400 include one or more bases or supports (one is shown 404) and one or more application nozzles or heads (eight are shown 408) disposed proximal the support 404. In at least one implementation, illustrated in FIGS. 4A and 4B, the supports 404 can be capable of or configured to hold, position, clamp, secure, or otherwise support one or more structural parts (eight are shown 402) disposed thereon. In at least one implementation, illustrated in FIG. 4A, the system 400 can include an enclosure 416 capable of or configured to contain the base 404 and the application heads 408. The enclosure 416 can also be capable of or configured to maintain the base 404 and the application heads 408 under vacuum conditions to facilitate deposition or formation of the structural parts 402.

The application heads 408 can be disposed proximal the base 404 and configured to deposit one or more materials to form the layers 410 of the structural parts 402. For example, as illustrated in FIG. 4A, the application heads 408 can be disposed above the base 404 and configured to deposit a plurality of layers 410 to form the structural part 402 on the base 404. In at least one implementation, the application heads 408 can be configured to deposit the layers 410 on a mandrel 412 (fixed or removable) to form the structural part 402. In another implementation, the application heads 408 can deposit at least one layer 410 to form a substrate and further deposit subsequent layers 410 adjacent the substrate to form the structural part 402. It should be appreciated that the first or substrate layer 410 can form or be a portion of the structural part 402.

While eight structural parts 402 and eight application heads 408 are illustrated in FIG. 4B, it should be appreciated that the system 400 can be capable of or configured to fabricate any number of structural parts 402 using any number of application heads 408. For example, the number of structural parts 402 that can be manufactured in the system 400 can vary widely from about 1 to about 5, about 10, about 15, or more. Similarly, the number of application heads 408 utilized in the system 400 can vary widely from about 1 to about 5, about 10, about 15, or more.

In at least one implementation, the base 404 can be configured to be translated or moved relative to the application heads 408. For example, the base 404 can be configured to rotate about a center 414 thereof relative to the application heads 408, which can be stationary or fixed. In another implementation, at least one of the application heads 408 can be configured to move relative to the base 404. For example, at least one of the application heads 408 can be configured to rotate about the base 404, which can be stationary or fixed, to form the structural parts 402. It should be appreciated that rotating the application heads 408 relative to the base 404 or rotating the base 404 relative to the application heads 408 can reduce time for fabrication, especially when fabricating multiple structural parts 402 and/or relatively large structural parts 402. In another example, the application heads 408 and/or the base 404 can be configured to move in any one or more dimensions relative to one another. For example, the application heads 408 and/or the base 404 can be translated or moved relative to one another along an X-axis, a Y-axis, a Z-axis, or any combination thereof.

Figure 5:
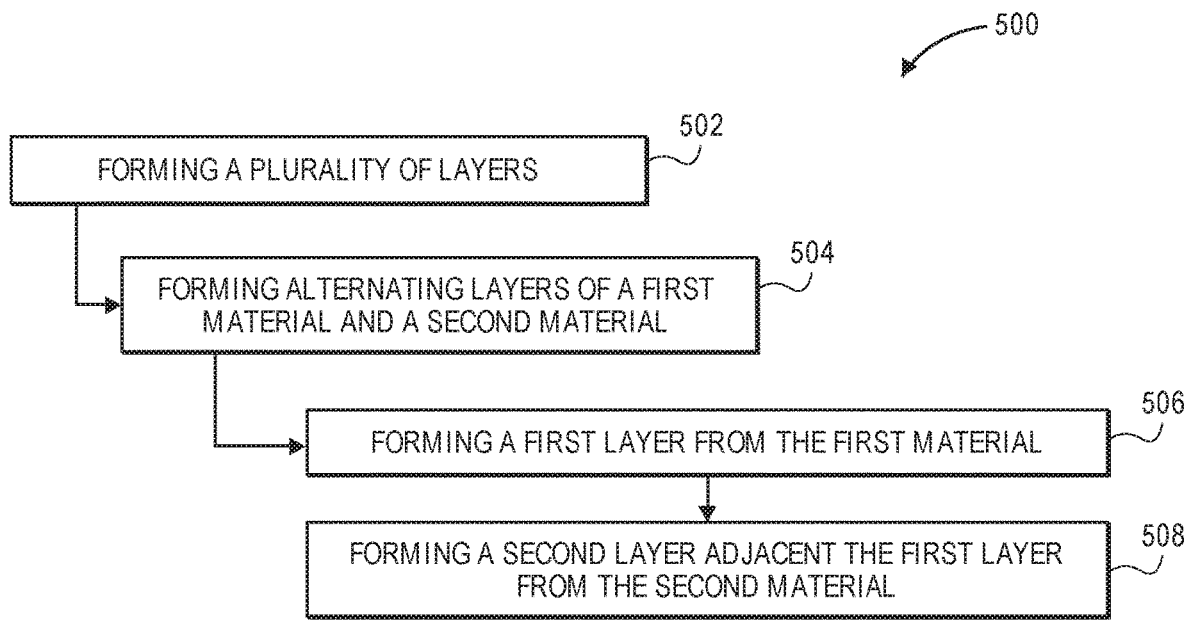
FIG. 5 illustrates a flowchart of a method for fabricating a structural part, according to one or more implementations disclosed.

FIG. 5 illustrates a flowchart of a method 500 for fabricating a structural part, according to one or more implementations disclosed. The method 500 can include forming a plurality of layers, as shown at 502. Forming the plurality of layers can include forming alternating layers of a first material and a second material, as shown at 504. Forming alternating layers of the first material and the second material 504 can include, forming a first layer from the first material, as shown at 506, and forming a second layer adjacent the first layer from the second material, as shown at 508.

Figure 6:
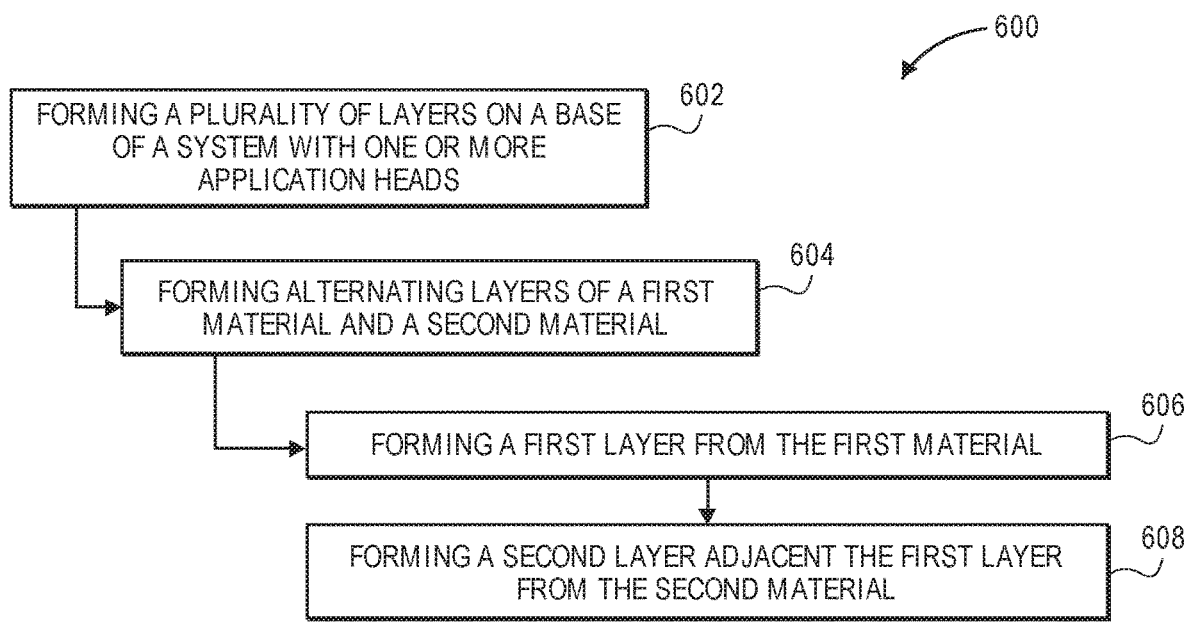
FIG. 6 illustrates a flowchart of a method for fabricating a structural part, according to one or more implementations disclosed.

FIG. 6 illustrates a flowchart of a method 600 for fabricating a structural part, according to one or more implementations disclosed. The method 600 can include forming a plurality of layers on a base of a system with one or more application heads, as shown at 602. Forming a plurality of layers on the base of the system can include forming alternating layers of a first material and a second material, as shown at 604. Forming alternating layers of a first material and a second material can include forming a first layer from the first material, as shown at 606, and forming a second layer adjacent the first layer from the second material, as shown at 608.

The system 400 and methods 500, 600 described herein can be utilized to fabricate any suitable structural part 100, 200, 300, 402 or a portion of any suitable structural part 100, 200, 300, 402. For example, the system 400 and methods 500, 600 can be utilized to fabricate one or more structural parts 100, 200, 300, 402 of a transportation vehicle or vessel. For example, the system 400 and methods 500, 600 can be utilized to fabricate a structural part 100, 200, 300, 402 of a train, a car, a bus, an automobile, an aircraft, such as an airplane or a helicopter, a boat, or the like. For example, the system 400 and methods 500, 600 can be utilized to fabricate a floor or canopy of a airplane or a helicopter, an airplane cockpit window, an airplane partition, a car body, an axel, a chassis, a ship hull, glass bottom of a boat, or the like. Other illustrative structural parts 100, 200, 300, 402 that can be fabricated by the system 400 and methods 500, 600 described herein can include, but are not limited to, impellers, blades, vanes, casings, diaphragms, stators, pistons, cylinders, rods, shafts, sleeves, engine blocks, turbine discs, shroud rings, nose cones, inlet cases, exhaust cases, intermediate casings, valve blocks, nozzle blocks, inlet nozzles, discharge or outlet nozzles, inlet walls, division walls, discharge walls, panels, airfoils, or other flight control surfaces, or the like. In at least one implementation, the system 400 and methods 500, 600 disclosed herein can also be capable of or configured to fabricate a structural window or a window that can at least partially provide structural attributes without a frame, such as a window for an aquarium or a bay-type window. Utilizing the system 400 and methods 500, 600 described herein to fabricate the structural parts 100, 200, 300, 402 can provide weight efficient or green transportation airplanes, cars, ships, or the like, at high fabrication rates to thereby reduce carbon dioxide emissions.

The present disclosure has been described with reference to exemplary implementations. Although a limited number of implementations have been shown and described, it will be appreciated by those skilled in the art that changes can be made in these implementations without departing from the principles and spirit of the preceding detailed description. It is intended that the present disclosure be construed as including all such modifications and alterations insofar as they come within the scope of the appended claims or the equivalents thereof.

What is claimed is:

1. A method for fabricating a structural part, the method comprising:
   forming a plurality of layers, wherein forming the plurality of layers comprises forming alternating layers of a first material and a second material, wherein forming the alternating layers comprises:
   forming a first layer from the first material; and
   forming a second layer directly adjacent the first layer from the second material,
   wherein the plurality of layers form the structural part, wherein the alternating layers are disposed directly adjacent a mandrel, wherein the mandrel is integral with the plurality of layers of the structural part, and wherein one or more dimensions of the structural part is greater than or equal to 0.05 cm.

2. The method of claim 1, wherein the plurality of layers are formed from a vacuum deposition process.

3. The method of claim 1, wherein the first material comprises an organic material.

4. The method of claim 3, wherein the organic material comprises one or more polymers.

5. The method of claim 1, wherein the second material comprises an inorganic material.

6. The method of claim 5, wherein the inorganic material comprises one or more silicates.

7. The method of claim 1, wherein the first material or the second material comprises one or more ceramics.

8. The method of claim 1, wherein forming the plurality of layers further comprises:
   forming a third layer directly adjacent the alternating layers and the mandrel such that the mandrel is interposed between the alternating layers and the third layer, wherein the third layer is formed from a third material; and
   forming a fourth layer directly adjacent the third layer from the third material.

9. The method of claim 8, wherein the third material comprises a metal.

10. The method of claim 8, wherein the first material comprises an organic material, and wherein the second material comprises an inorganic material.

11. The method of claim 10, wherein the organic material comprises one or more polymers, and wherein the inorganic material comprises one or more silicates, and wherein the third material comprises a metal.

12. The method of claim 1, wherein forming the plurality of layers further comprises:
   forming a third layer from a third material;

forming a fourth layer adjacent the third layer from the third material; and forming the first layer adjacent the third layer from the first material.

13. The method of claim 12, wherein the third material comprises a metal.

14. The method of claim 13, wherein the structural part is a structural part of a transportation vehicle or vessel.

15. The method of claim 1, further comprising binding the first layer and the second layer with one another.

16. The method of claim 1, wherein the structural part does not form a portion of a coating or an encapsulation.

17. A method for fabricating a structural part, the method comprising:

forming a plurality of layers on a base of a system with one or more application heads, wherein forming the plurality of layers comprises forming alternating layers of a first material and a second material, wherein forming the alternating layers comprises:

forming a first layer from the first material; and forming a second layer directly adjacent the first layer from the second material, wherein the plurality of layers form the structural part, wherein the alternating layers are disposed directly adjacent a mandrel, wherein the mandrel is integral with the plurality of layers of the structural part, and wherein one or more dimensions of the structural part is greater than or equal to 0.05 cm.

18. The method of claim 17, further comprising moving the base relative to the one or more application heads.

19. The method of claim 17, wherein forming the plurality of layers further comprises forming a third layer directly adjacent the alternating layers and the mandrel with the one or more application heads such that the mandrel is interposed between the alternating layers and the third layer, wherein the third layer is formed from a third material.

20. The method of claim 17, wherein the plurality of layers are formed from a vacuum deposition process.

* * * * *